United States Patent [19]

Yagi

[11] 4,007,478
[45] Feb. 8, 1977

[54] FIELD EFFECT TRANSISTOR
[75] Inventor: Hajime Yagi, Tokyo, Japan
[73] Assignee: Sony Corporation, Tokyo, Japan
[22] Filed: Oct. 17, 1973
[21] Appl. No.: 407,285

Related U.S. Application Data

[63] Continuation of Ser. No. 282,898, Aug. 23, 1972, abandoned.

[30] Foreign Application Priority Data

Aug. 26, 1971   Japan .................. 46-65271

[52] U.S. Cl. .................... 357/41; 357/23; 357/43; 357/46; 357/48; 357/89
[51] Int. Cl.² ......................... H01L 27/02
[58] Field of Search ....... 317/235 G, 235 B, 235 E, 317/235 AM; 357/23, 41, 43, 46, 48, 89

[56] References Cited
UNITED STATES PATENTS

| 3,445,734 | 5/1969 | Pecoraro et al. | 317/235 |
|---|---|---|---|
| 3,456,168 | 7/1969 | Tatom | 317/235 |
| 3,461,360 | 8/1969 | Barson et al. | 317/235 |
| 3,600,647 | 8/1971 | Gray | 317/235 |
| 3,631,310 | 12/1971 | Das | 317/235 R |
| 3,653,978 | 4/1972 | Robinson et al. | 148/1.5 |
| 3,685,140 | 8/1972 | Engeler | 29/571 |
| 3,711,940 | 1/1973 | Allison et al. | 29/571 |

FOREIGN PATENTS OR APPLICATIONS

| 466,434 | 1/1969 | Switzerland | 317/235 |

Primary Examiner—Michael J. Lynch
Assistant Examiner—Joseph E. Clawson, Jr.
Attorney, Agent, or Firm—Lewis H. Eslinger; Alvin Sinderbrand

[57] ABSTRACT

An insulated gate field effect transistor having a narrow channel made by double diffusion. The double-diffused MIS transistor has a buried layer of high impurity concentration beneath the channel region except the portions of the drain contact region or drain electrode. The buried layer of high impurity concentration is of the same impurity as that of the channel region and is so located that the channel-spreading resistance is drastically reduced while the capacitance between the drain and the channel is maintained as small as possible.

6 Claims, 11 Drawing Figures

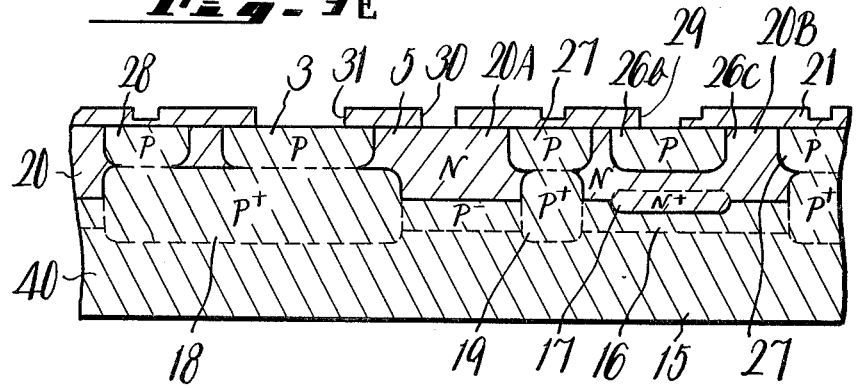
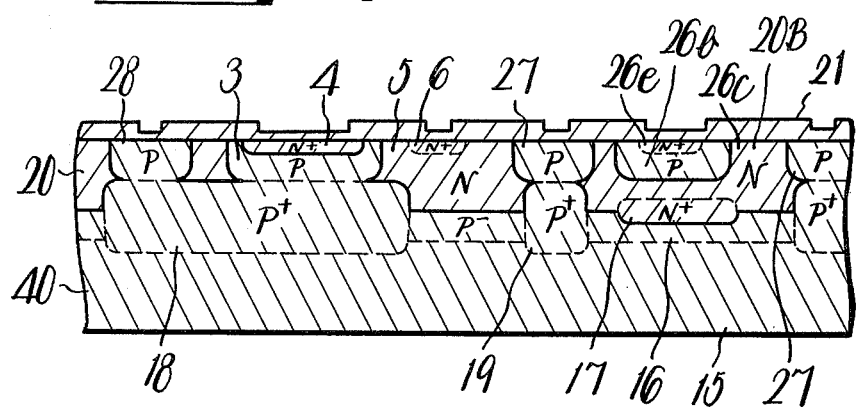
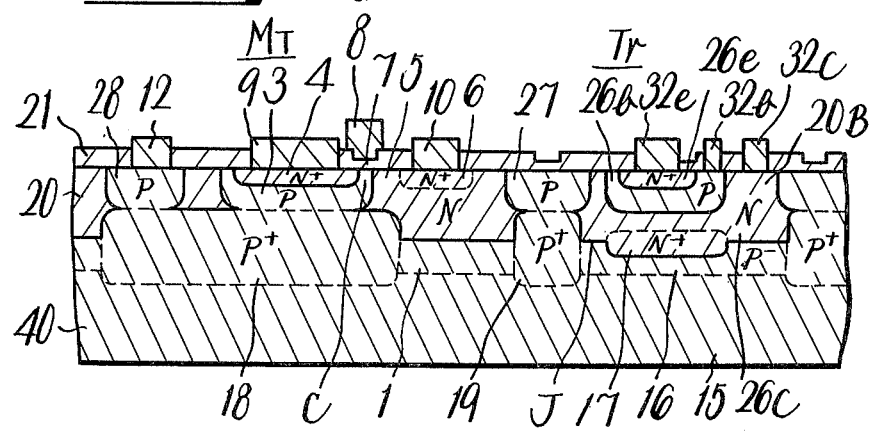

FIELD EFFECT TRANSISTOR

This is a continuation of application Ser. No. 282,898, filed Aug. 23, 1972 now abandoned.

BACKGROUND OF THE INVENTION

1. Field of the Invention

This invention relates in general to an MIS field effect transistor and more particular to one having a very narrow channel made by two-stage diffusion.

2. Description of the Prior Art

Double-diffused MIS transistors have been proposed in the prior art as described in Electronics issued on Feb. 15, 1971, pp 99–104. The double-diffused MIS transistor has a very narrow channel determined by a two-stage diffusion through a single mask opening. As the frequency response of any MIS transistor is determined primarily by channel length, the double-diffused MIS transistor has a good frequency response.

A substrate of a semiconductor body has usually low impurity concentration such as $10^{14} \sim 10^{16}$ atoms/cm$^3$ in order that the capacitance of the P-N junction formed between the drain and the substrate is made small. Accordingly, when the substrate is grounded in order to apply ground potential to the channel region, the spreading resistance in the substrate, which is rather great, deteriorates the overall frequency response.

SUMMARY OF THE INVENTION

The present invention is an improved device over the prior art device in that a further region is provided in a semiconductor substrate which has the same conductivity type as the channel region but higher impurity concentration and is located under the channel region except for the portion of the substrate which is under the drain contact region or the drain electrode. With such an arrangement, a MIS transistor has the best frequency response because the channel-spreading resistance is reduced to the lowest value while the capacitance between the drain and the substrate is also maintained at the lowest value.

BRIEF DESCRIPTION OF THE DRAWING

FIGS. 3A through 3G, inclusive, show each step of manufacturing another embodiment of the present invention applied to an integrated semiconductor circuit having an MIS field effect transistor and a conventional bipolar transistor;

DESCRIPTION OF THE PREFERRED EMBODIMENTS

Figure 1:
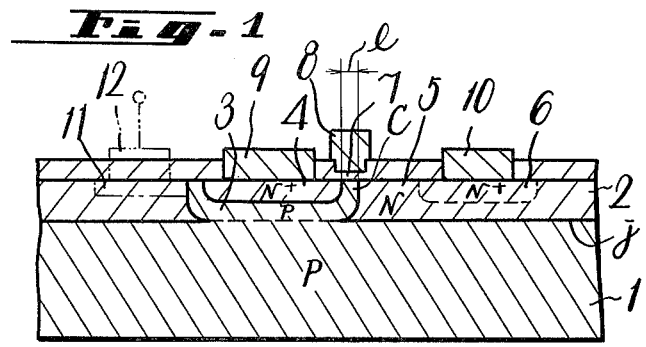
FIG. 1 is a sectional view of a prior art MIS field effect transistor.

For better understanding the present invention, a description will be now given of a double-diffused MIS field effect transistor of the prior art with reference to FIG. 1.

In the conventional double-diffused MIS field effect transistor shown in FIG. 1, a semiconductor body which forms a P-type substrate region 1 has a layer 2 of, for example, low impurity concentration N-type semiconductor formed by an epitaxial growth, and a P-type channel region 3 is selectively formed in the semiconductor region 2. An N-type source region 4 of high impurity concentration is formed in the channel region 3 at a position in alignment with a window of the mask used in the case of forming the channel region 3. The region 4 is formed in a selective diffusion manner or by means of a common window of the mask. In this case, the depth of the diffusion of the source region 4 is selected to be smaller than that of the channel region 3. At the same time that the source region 4 is formed by diffusion, a high impurity region 6 for drain electrode contact is formed at the central portion of an N-type drain region 5 adjacent the channel region 3, the high impurity region 6 forming a part of the drain region. A gate insulating layer 7 is formed on the channel region 3 between the source region 4 and the drain region 5, and a gate electrode 8 is formed on the gate insulating layer 7. A source electrode 9 is formed on the source region 4 and a drain electrode 10 is formed on the region 6.

With such an MIS field effect transistor, since the length l of the channel portion of channel region 3 beneath the gate insulating layer 7 and between the regions 4 and 5 the length l of a portion c, where an inversion layer is formed, is determined in accordance with the difference between diffusion widths of the regions 3 and 4 in the lateral direction, the length l can be made small enough to increase the mutual conductance $g_m$ and the MIS field effect transistor can be made in an integrated circuit, Or IC, substrate with other semiconductor elements simultaneously because it is formed by a so-called planer technique.

However, in the MIS field effect transistor constructed as above, in order to decrease the capacity of the P-N junction j formed between the drain region 5 and the substrate 1, the impurity concentration of the substrate 1 is selected low, for example, from $10^{14}$ to $10^{16}$ atoms/cm$^3$. Accordingly, although an electrode is formed on the side of the substrate 1 for applying the earth potential to, for example, the channel region 3, the high-frequency characteristics are deteriorated due to the great resistance caused by the high resistivity of the substrate 1.

It may also be possible for providing such an electrode that, as shown in dotted lines in FIG. 1, a diffusion region 11 of the same conductivity type as that of the channel region 3 is formed for ohmic contact in the semiconductor layer 2 along one side of the channel 3. An electrode 12 is attached to the diffusion region 11 in ohmic contact. In this case, however, the spreading resistance of the channel region 3 is high and the ohmic contact region 11 must have a large area.

A field effect transistor of the present invention free from the drawbacks encountered in an MIS field effect transistor of the prior art will be described hereinbelow.

Figure 2:
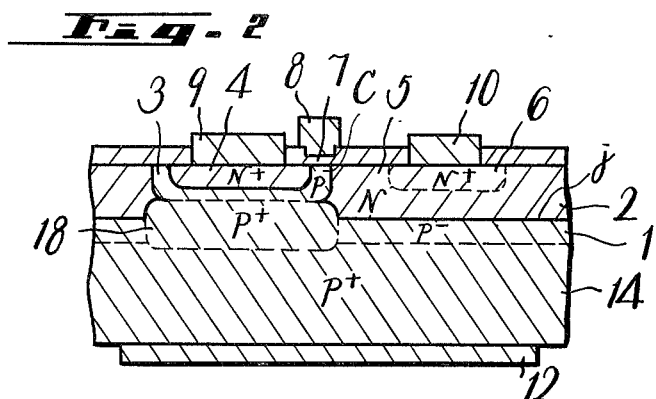
FIG. 2 is a sectional view of an MIS field effect transistor embodying the novel teachings of the present invention.

An embodiment of the field effect transistor of the present invention will be now described with reference to FIG. 2 in which similar reference numerals to those of FIG. 1 designate similar elements and their description will be omitted for the sake of brevity.

According to the present invention the substrate 1, which has a relatively low impurity concentration from $10^{14}$ to $10^{16}$ atoms/cm$^3$, is formed beneath at least the drain electrode 10 or the portion opposing the drain electrode 10, or beneath the high impurity concentration region 6 for the drain electrode 10 if the region 6 is formed. A buried layer 18, which was a relatively high impurity concentration, for example, from $10^{18}$ to $10^{20}$ atoms/cm$^3$, is low in resistivity and is of same conductivity type as the channel region 3, is buried in the layer 2 and the substrate 1 and under the channel region 3 to correspond to the bottom of the channel region 3 and to have as wide a contact therewith as possible. In the embodiment shown in FIG. 2, a region 14 of P-type high impurity concentration is provided under the buried layer 18 and under the substrate 1, and the electrode 12 is connected in ohmic contact to the region 14 or its free end surface in.

With the field effect transistor of the present invention constructed as described above, since the buried layer 18 of high impurity concentration is provided under the channel region 3, the spreading resistance of the channel region 3 can be made low. Especially, in the case where the region 14 of high impurity concentration is provided and the electrode 12 for the channel region 3 is provided on the free end surface of the region 14 as shown in FIG. 2, there is no need to provide the diffusion region 11 shown in FIG. 1 to decrease the area, so that the size of the device can be reduced, accordingly.

Further, the portion in contact with the drain region 5, especially the portion opposite the drain electrode 10 to which a bias voltage is effectively applied, and the portion opposite the region 6 for the drain electrode 10 are the substrate 1 of low imputity concentration, so that the capacity of the P-N junction $j$ therebetween can be made small even if the spreading resistance of the channel region 3 is low, with the result that the breakdown can be improved.

In order that the advantages and features of the present invention be more clearly understood, a semiconductor integrated circuit, in which the field effect transistor of the invention is employed as an N-channel MIS transistor and an NPN transistor, and a method of making the same, by way of example, will be now described with reference to FIGS. 3A to 3G.

At first, a semiconductor substrate or wafer, for example, a silicon substrate 15 which has a high imputity concentration from $10^{18}$ to $10^{20}$ atoms/cm$^3$ of a P-type conductivity is prepared. Then, a semiconductor layer, for example, a silicon layer 16 which has relatively low impurity concentration from $10^{14}$ to $10^{16}$ atoms/cm$^3$ and the same conductivity type to that of the substrate 15 is formed on the latter by epitaxial growth (refer to FIG. 3A).

A collector buried layer 17 of high impurity concentration and N-type conductivity is selectively formed in the semiconductor layer 16 at the position where it will be opposite the collector junction of a transistor which will be formed. The buried layer 18 of high impurity concentration and P-type conductivity is formed in the layer 16 at the position opposite the channel region of a MIS field effect transistor, which will be formed, for reducing the resistance of the channel region, and a buried layer 19 for isolation is also formed in the layer 16 at the position where the channel region of MIS field effect transistor, which will be formed, must be electrically isolated from an NPN transistor, which will be also formed (refer to FIG. 3B). The latter buried layer 19 for isolation may be formed to be seen from above as a lattice or an annular shaped one.

A semiconductor, for example, silicon layer 20 of relatively low imputity concentration, for example, from $10^{15}$ to $10^{16}$ atoms/cm$^3$ and N-type conductivity is epitaxially grown on the semiconductor layer 16 to form a semiconductor substrate 40. By heating during the formation of the layer 20 by epitaxial growth or by further heating treatment, if necessary, the impurities in the respective buried layrs 17, 18 and 19 are diffused upwardly into the semiconductor layer 20 to extend the layers 17, 18 and 19 into the layer 20 (refer to FIG. 3C). In this case, since the diffusion coefficients of the impurities in the layers 18 and 19 are greater than that of the impurity in the layer 17, the extension lengths of the layers 18 and 19 in the semiconductor larger 20 are layer than that of the layer 17 in the layer 20. The impurity concentrations of thus formed layers 17, 18 and 19 are selected approximately from $10^{18}$ to $10^{20}$ atoms/cm$^3$.

An insulating layer 21 such as, for example, an SiO$_2$ layer, which will be used as a diffusion mask, is coated on the layer 20. Windows 22, 23 and 24 are respectively formed in the insulating layer 21 by photo engraving or etching at the positions corresponding to the buried layers 17, 18 and 19. A further window 25 is also formed in the insulating layer 21 at the position corresponding to the layer 18 with a predetermined distance from the window 23. In this case, the window 24 is formed in lattice or annular shape to correspond to full area of the layer 19.

Through the mask, namely the windows 22, 23, 24 and 25 in the insulating layer 21, a P-type impurity is diffused into the layer 20 to form a base region 26$b$, the channel region 3, an isolation region 27 and a region 28 for making an electrode 3 (refer to FIG. 3D). In this case, the diffusion depths of the respective regions 3, 28 and 27 are so selected that they reach the buried layers 18 and 19, but the depth of the base region 26$b$ is so selected that it does not reach the buried layer 17.

Thus, the semiconductor layer 20 is divided by the buried layer 19 and the similar diffusion layer 27 for isolation into a part 20A which will form MIS field effect transistor later and a part 20B which will produce an NPN transistor. In the part 20A, there are formed the channel region 3 and the drain region 5 consisting of the N-type region of the semiconductor layer 20 in which the channel region 3 is not formed. Meanwhile, in the part 20B there are formed the base region 26b and a collector region 26c consisting of the N-type region of the semiconductor layer 20 in which the base region 26b is not formed.

It may be possible that when the respective regions 26$b$, 3, 27 and 28 are treated by diffusion, the surface of the semiconductor layer 20 exposed outside through the windows 22, 23, 24 and 25 will be oxidized to close these windows with the insulating layer 21.

The insulating layers 21 on the base region 26b, the drain region 5 and the channel region 3 are partially removed to form windows 29, 30 and 31, respectively (refer to FIG. 3E). In this case, the windows 29 and 30 may be formed by, for example, photoetching process or the like, but it be required that the window 31 on the channel region 3 is made to coincide in position with the window 23 which is used during the formation of the channel region 3. For this purpose, the fact that the insulating layer 21 formed in the window 23 during the diffusion process of the channel region 3 is thinner than that of its marginal portion is utilized and the insulating layer within the window 23 is removed by an etching process to provide the window 31 in coincidence with the window 23.

Through these windows 29, 30 and 31 an N-type impurity of high concentration is diffused into the regions 26b, 5 and 3, respectively, to form an emitter region 26e, the drain region 6 for the drain electrode and the source region 4 (refer to FIG. 3F). In this case, the drain region 6 is formed in the position where it does not oppose the buried layer 18. In other words, the buried layer 18 is not positioned under the region 6.

If necessary, it may be desirable to remove by etching the insulating layer 21 between the source region 4 and the drain region 5 on the channel region 3 and to form the gate insulating layer 7 instead. On the gate insulating layer 7 the gate electrode 8 is formed. The source electrode 9 and the drain electrode 10 are respectively provided in ohmic contact with the source region 4 and the drain region 6 through windows bored through the insulating layer 21 on the source region 4 and the drain region 6, respectively. At the same time, a window is bored in the insulating layer 21 over the region 28 and the electrode 12 is formed in ohmic contact with the region 28 through the window. Simultaneously, windows are bored in the insulating layer 21 over the emitter region 26e, the base region 26b and the collector region 26c, and through these windows an emitter electrode 32e, a base electrode 32b, and a collector electrode 32c respectively, are formed in ohmic contact with the corresponding regions. Thus, a semiconductor IC circuit is obtained in which on the common semiconductor substrate 40 there are provided a MIS field effect transistor $M_T$ and an NPN-type transistor Tr (refer to FIG. 3G). The MIS field effect transistor $M_T$ and the NPN-type transistor Tr are electrically isolated by the P-N junction j bounded by the collector region 26c of N-type conductivity, the buried layer 17 of the same conductivity type, the P-type conductivity isolation regions 27, and 19 and the semiconductor layer 16 of the same conductivity type.

In the foregoing embodiment, the window 31 for providing the source region 4 coincides with the window 23 used for providing the channel region 3, but in practice it is enough that the window 31 coincides with the window 23 in such a manner that the marginal portion of the inversion layer, namely the side of the window 23 for providing a channel c coincides with the corresponding marginal portion of the window 31.

With the IC circuit formed as mentioned above, since the buried layer 18 of high impurity concentration is provided in the bottom portion of the channel region 3 for the MIS field effect transistor $M_T$, the spreading resistance of the channel region 3 is made low to improve the high frequency characteristic thereof.

In the invention, the buried layer 18 is selectively formed and the part opposite the region 6 of the region 5 for the drain electrode 10 is the substrate 1 made of the semiconductor layer 16 of low imputiry concentration, so that the capacitance between the drain and the substrate can be made small. Further, since the buried layer 18 is selectively formed, other circuit elements, for example, NPN-type transistors can be formed in the common semiconductor substrate 40.

In the foregoing embodiment, the MIS field effect transistor $M_T$ and the bipolar transistor Tr are provided but it is possible that, instead of the transistor Tr or in addition to the same, other circuit elements will be formed to provide an IC circuit.

Figure 4:
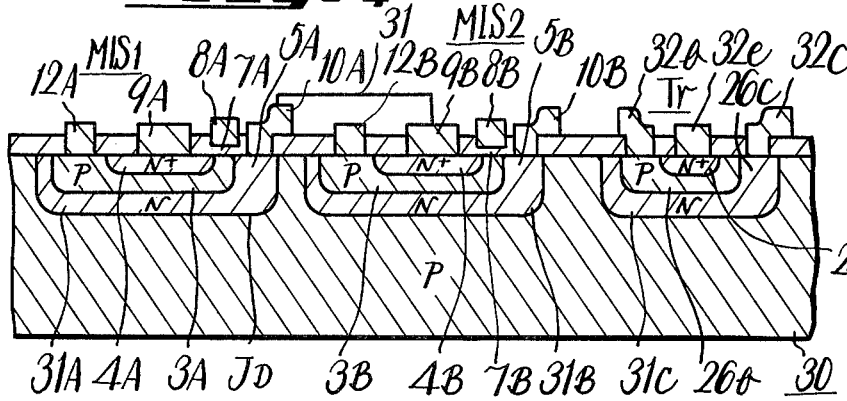
FIG. 4 is a sectional view of a cascaded two double-diffused MIS field effect transistors according to the prior art.

Further, it has previously been known that, as shown in FIG. 4 in which reference numerals similar to those in the foregoing figures shown the similar elements, two MIS field effect transistors $MIS_1$ and $MIS_2$ are formed on a common semiconductor substrate 30 and when the two MIS transistors $MIS_1$ and $MIS_2$ are connected in cascade, the feedback capacity can be reduced In the prior art, when two MIS transistors are connected in cascade, with the drain of one MIS transistor is connected to the source of the other MIS transistor, a so-called MIS tetrode is formed on the common semiconductor substrate 30 with the NPN-type bipolar transistor Tr. Regions 31A, 31B and 31C of N-type conductivity are separately formed in the semiconductor substrate 30 of P-type conductivity, respectively. One MIS field effect transistor $MIS_1$ is formed in the region 31A, the other MIS field effect transistor $MIS_2$ is formed in the region 31B, and the bipolar transistor Tr is the region 31C. A P-type channel region 3A and an N-type source region 4A are formed in the region 31A by diffusion through windows whose marginal edges on the side where channels are formed are common. The portion of the region 31A where the regions 3A and 4A are not formed is used as a drain region 5A. Meanwhile, in the region 31B there are formed a channel region 3B, a source region 4B, and a drain region 5B by the similar method in correspondence with the regions 3A, 4A and 5A formed in the region 31A. A first gate insulating layer 7A is formed on the channel region 3A between the source region 4A and the drain region 5A, and a first gate electrode 8A is formed on the first gate insulating layer 7A. Similarly, a second gate insulating layer 7B is formed on the channel region 3B between the source region 4B and the drain region 5B, and a second gate electrode 8B is formed on the second gate insulating layer 7B. First and second source electrodes 9A and 9B are provided on the source regions 4A and 4B in ohmic contact therewith, respectively, and first and second drain electrodes 10A and 10B are provided on the drain regions 5A and 5B in ohmic contact therewith, respectively. The drain electrode 10A of the first MIS field effect transistor $MIS_1$ is connected to the source electrode 9B of the second MIS field effect transistor $MIS_2$ by means of a lead wire 31 or an interconnection made of a conductive layer. Electrodes 12A and 12B are provided on the first and second channel regions 3A and 3B in ohmic contact therewith, respectively, for applying a predetermined potential, for example, an earth potantial to the latter. In the region 31C, which is taken as, for example, a collector region 26c, a P-type base region 26b is partially formed and an N-type source region 26e is formed partially in the base region 26b. A collector electrode 32c, a base electrode 32b and an emitter electrode 32e are respectively provided on the regions 26c, 26b and 26e in ohmic contact therewith to form the transistor Tr.

With such a construction, however, there is a drawback that the spreading resistance of the channel regions 3A and 3B of the first and second MIS field effect transistors $MIS_1$ and $MIS_2$ becomes high.

Further, in such a construction, the area of the drain region 5A of the first MIS field effect transistor $MIS_1$ covers the whole of the channel region 3A and is relatively large, and a P-N junction $J_D$ formed on the outer surface of the drain region 5A is large in area, so that its junction capacity is also large.

Figure 5:
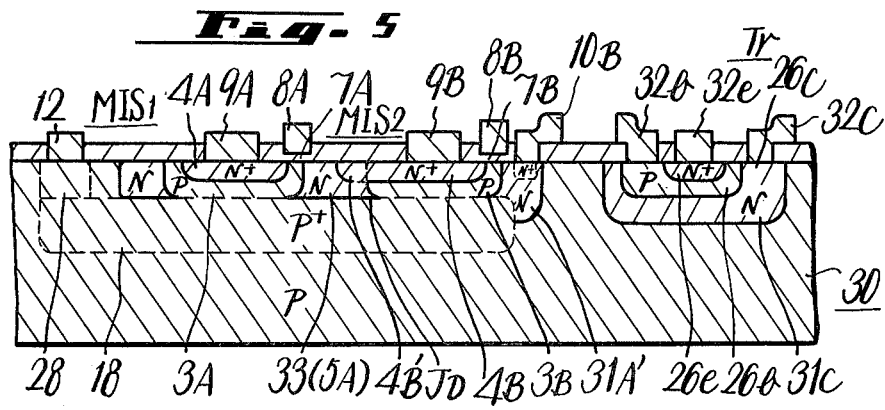
FIG. 5 is a sectional view of a double-diffused MIS tetrode of the present invention applied to the arrangement of FIG. 4.
Figure 7A:
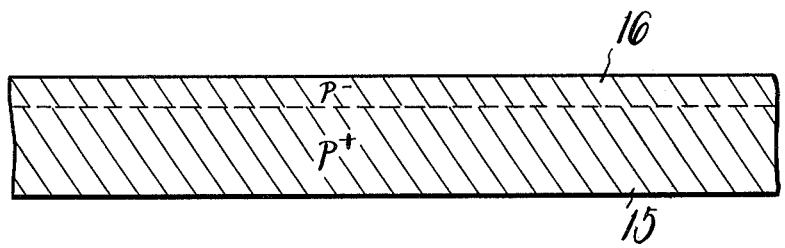
Figure 7B:
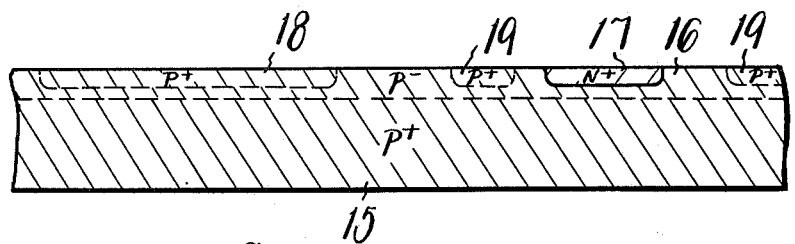
Figure 7C:
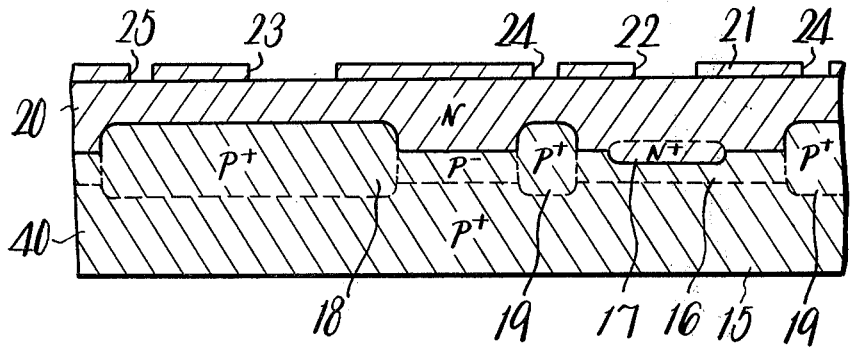
Figure 7D:
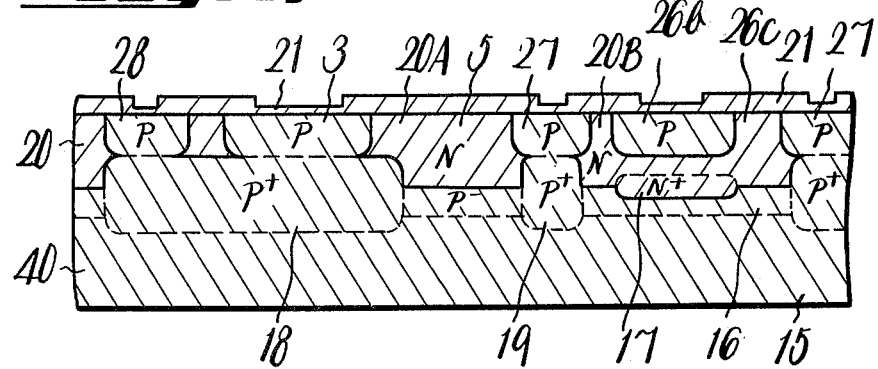

FIG. 5 shows an embodiment in which the present invention is applied to the IC circuit construction shown in FIG. 4. In FIG. 5, reference numerals similar to those in FIG. 4 designate similar elements and their description will be omitted for the sake of simplicity. In the embodiment of the invention shown in FIG. 5, the transistor Tr is formed in, for example, the region 31C by the similar manner to that described in connection with FIG. 4 and the two MIS field effect transistors $MIS_1$ and $MIS_2$ are formed in a common region 31A' of N-type conductivity. An impurity of P-type conductivity is selectively diffused into the region 31A' to form two separate channel regions 3A and 3B of P-type conductivity and then an impurity of N-type conductivity is diffused into the two channel regions 3A and 3B, respectively, through the same windows which are used when the channel regions 3A and 3B are formed to form source regions 4A and 4B. Further, a diffusion region 4B' of N-type conductivity is formed adjacent the source region 4B of the second MIS field effect transistor $MIS_2$ at the position opposite the first MIS field effect transistor $MIS_1$ to connect the second source region 4B to an island region 33 of N-type conductivity formed in the region 31A' between the two channel regions 3A and 3B. Thus, the island region 33 serves as the drain region 5A of the first MIS field effect transistor $MIS_1$, and the source region 4B of the second MIS field effect transistor $MIS_2$ is connected to the island region 33 through the region 4B', so that the drain electrode 10A, which was necessary in the embodiment of FIG. 4, can be dispensed with. Thus, a so-called MIS tetrode, which is constructed by cascading the first and second MIS field effect transistors $MIS_1$ and $MIS_2$, can be obtained.

With the present invention, especially the buried layer 18 of high impurity concentration with the same conductivity to those of the channel regions 3A and 3B is formed in the semiconductor substrate 30 at the position corresponding to the bottoms of the two channel regions 3A and 3B and over the both regions. In this case, the buried layer 18 is formed in such a manner that it does not extend beneath the drain electrode of the second MIS field effect transistor $MIS_2$, that is, the portion opposite the drain electrode 10B of the MIS tetrode or beneath the electrode 10B.

A P-type diffusion layer 28 is formed in the semiconductor substrate 30 between the surface from which the two MIS field effect transistors $MIS_1$ and $MIS_2$ are provided and the buried layer 18 and then the electrode 12 for the channel regions 3A and 3B are formed on the diffusion layer 28 in ohmic contact therewith.

With such a construction, since the buried layer 18 of high imputiry concentration is formed beneath the channel regions 3A and 3B, the spreading resistance between the channel regions 3A and 3B and the electrode 12 can be low, and both the channel regions 3A and 3B can be connected with low resistance. The practical integrated degree of the invention may be improved as compared with the case where the electrodes 12A and 12B are separately prepared for the respective channel regions 3A and 3B, as shown in FIG. 4.

Further, since the drain region 5A of the first MIS field effect transistor $MIS_1$, namely the island region 33, is formed only between the channel regions 3A and 3B in the invention, the area of the P-N junction $J_D$ at its bottom is made much smaller than that of the embodiment of FIG. 4 with the result that the capacity of the P-N junction $J_D$ of the invention is reduced one more place or one figure as compared with the embodiment of FIG. 4.

In the embodiment of the invention shown in FIG. 5, the base region 26b of the transistor Tr, the first and second channel regions 3A and 3B of the MIS tetrode and the region 28 are formed by the same diffusion process. In addition the emitter region 26e of the transistor Tr and the source regions 4A and 4B of the MIS tetrode are formed by the same diffusion process. Further, the IC circuit shown in FIG. 5 may be obtained by the similar process described in connection with FIGS. 3A to 3G.

With the invention described above, since the spreading resistance of the channel region of the MIS field effect transistor can be made low, its high frequency characteristic may be improved.

The above embodiments of the invention are adapted to the P channel MIS field effect transistor, but the present invention may be adapted to a semiconductor device with the N channel MIS field effect transistor with the similar effects.

It will be apparent that many changes and variations can be effected without departing from the scope of the novel concepts of the invention.

I claim as my invention:
1. An MIS field effect transistor comprising:
   a body of semiconductor material including
   a. a first region of semiconductor material of one conductivity type extending to a surface of said body;
   b. a second region of semiconductor material of the same type conductivity as that of said first region and extending to said surface and being spaced laterally from said first region;
   c. a single substantially cup-shaped region only of semiconductor material of the opposite type conductivity to that of said first and second regions, said cup-shaped region containing said second region and having a portion located between said first and second regions and forming at least one PN junction therewith, said portion of the cup-shaped region of semiconductor material extending to said surface of the semiconductor body to provide a narrow channel; and
   d. a buried region of semiconductor material of the opposite conductivity type having a greater impurity concentration than that of said cup-shaped region and being at least substantially laterally coextensive with, and located in underlying relation to said cup-shaped region and in contact therewith over substantially the entire lateral extent of the latter, said buried region being spaced laterally from said first region with the margin of said buried region which is closest to said first region being spaced from said first region in the lateral direction toward said cup-shaped region;
   e. first and second electrodes respectively connected to said first and second regions at said surface;
   f. a control electrode electrically insulated from the semiconductor body and being positioned substantially over the entire area of said portion of said cup-shaped region extending to the surface of said body; and g. means to apply a potential to said cup-shaped region through said buried region from the outside of said semiconductor body.

2. An insulated-gate field effect transistor comprising:
   a. a semiconductor substrate, a first region of diffused semiconductor material of one conductivity type in said substrate;
   b. a second region of diffused semiconductor material of the opposite conductivity type in said substrate to provide a source region, said second diffused region being within said first diffused region so that said first region forms a shell-like narrow channel region having an edge portion extending to the semiconductor surface;
   c. a drain region of the opposite conductivity type in said semiconductor substrate and spaced laterally from said first region;
   d. a region buried in said substrate and being of semiconductor material of the same type conductivity as that of said first region but having a greater impurity concentration than that of said first region, said buried region being at least substantially laterally coextensive with, and located in underlying relation to said first region and in contact therewith over substantially the entire lateral extent of the latter, the margin of said buried region which is closest to said drain region being spaced from said drain region in the lateral direction toward said first region;
   e. a first electrode connected to said drain region;
   f. a second electrode connected to said second region as a source electrode; and
   g. a control electrode electrically insulated from the semiconductor surface and positioned over said edge portion of said channel region.

3. An insulated-gate field effect transistor as claimed in claim 2; in which the impurity concentration of a region of said substrate extending under said drain region from said buried region is lower than that of said channel region.

4. An insulated-gate field effect transistor as claimed in claim 2, in which an additional buried layer is formed in underlying relation to said drain region, the conductivity type of said additional buried layer being the same as that of the first mentioned buried region but the impurity concentration of said additional buried layer being lower than that of said first mentioned buried region, and said additional buried layer extending contiguous to said first mentioned buried region at an end of the latter.

5. An insulated-gate field effect transistor comprising:
   a. a semiconductor substrate;
   b. first and second diffused regions of a first conductivity type laterally spaced in said semiconductor substrate and extending to a surface of the latter;
   c. third and fourth diffused regions of a second conductivity type, said third diffused region being wholly within said first region and said fourth diffused region extending from within said second region beyond the latter at one end of said second region toward said first region;
   d. a drain region of the second conductivity type in said semiconductor substrate and spaced laterally from said second region at the other end of the latter;
   e. a buried region which is of the same conductivity type as that of said first and second regions but has an impurity concentration higher than the latter, said buried region being spaced from said drain region and located in underlying relation to said first and second regions and in contact therewith over substantially the entire lateral extents of said first and second regions;
   f. an electrode for said drain region;
   g. a source electrode for said third region;
   h. a first control electrode which is electrically insulated from said surface of the semiconductor at an end of said first region; and
   i. a second control electrode which is electrically insulated from said surface of the semiconductor at said other end of said second region.

6. An insulated-gate field effect transistor as claimed in claim 5, in which the region between said first and fourth regions is of the same conductivity type as said fourth region and has an impurity concentration lower than that of said fourth region, and the region between said drain region and said second region is of the same conductivity type as said drain region and has an impurity concentration lower than that of said drain region.

* * * * *